United States Patent
Khayrallah et al.

(10) Patent No.: US 6,597,743 B1
(45) Date of Patent: Jul. 22, 2003

(54) REDUCED SEARCH SYMBOL ESTIMATION ALGORITHM

(75) Inventors: Ali S. Khayrallah, Apex, NC (US); Gregory E. Bottomley, Cary, NC (US); Ravinder David Koilpillai, Apex, NC (US); Kambiz Zangi, Durham, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/454,577

(22) Filed: Dec. 7, 1999

(51) Int. Cl.$^7$ .............................. H04L 23/02; H04L 5/12
(52) U.S. Cl. ........................ 375/265; 375/261; 375/262
(58) Field of Search ................................ 375/261, 265, 375/341, 362; 371/43

(56) References Cited

U.S. PATENT DOCUMENTS

| | | | |
|---|---|---|---|
| 5,502,735 A | * 3/1996 | Cooper | 371/43 |
| 5,684,811 A | 11/1997 | Doran | 371/43 |
| 5,781,569 A | 7/1998 | Fossorier et al. | 371/43.7 |
| 5,784,392 A | 7/1998 | Czaja et al. | 371/43.1 |
| 5,844,946 A | * 12/1998 | Nagayasu | 375/341 |
| 5,881,075 A | 3/1999 | Kong et al. | 371/43.7 |
| 5,887,007 A | 3/1999 | Iwata et al. | 371/43.7 |
| 5,887,036 A | 3/1999 | Temerinac | 375/341 |
| 5,901,182 A | 5/1999 | Kot | 375/341 |
| 5,905,742 A | 5/1999 | Chennakeshu et al. | 371/43.4 |
| 5,933,462 A | * 8/1999 | Viterbi et al. | 375/341 |
| 6,028,899 A | * 2/2000 | Petersen | 375/341 |
| 6,442,212 B1 | * 8/2002 | Kratochwil | 375/265 |

OTHER PUBLICATIONS

Viterbi, Andrew J.; "An Intuitive Justification and a Simplified Implementation of the Map Decoder for Convolutional Codes"; IEEE Journal on Selected Areas in Communications, vol. 16, No. 2, Feb. 1998, pp. 260–264.

Anderson, John B.; "Limited Search Trellis Decoding of Convolutional Codes"; IEEE Transactions on Information Theory, Sep. 1989, No. 5, pp,944–955.

* cited by examiner

*Primary Examiner*—Stephen Chin
*Assistant Examiner*—Sam K. Ahn
(74) *Attorney, Agent, or Firm*—Coats & Bennett, P.L.L.C.

(57) ABSTRACT

A reduced search symbol estimation algorithm includes a forward recursion, a backward recursion, and a combining step. To reduce complexity, during the forward and backward recursions, the number of survivor states retained at each stage is less than the total number of states of the trellis. The survivor states are selected from a group of candidate states, that are connected by branches to survivors from the previous stage of the recursion. The decoder compares the accumulated path metrics for each candidate state and retains a specified number of states that is less than the total possible number of states. For the forward recursion, the retained states or survivor states, denoted as $Q_k$, are stored along with the corresponding state metrics. For the backward recursion, the retained states, denoted as $R_k$, are stored along with the corresponding state metrics. During the combining step, the computation of a soft value is restricted to branches (s',s) connecting survivor states s' and s in the forward and backward recursions respectively.

11 Claims, 8 Drawing Sheets

REDUCED SEARCH SYMBOL ESTIMATION ALGORITHM

FIELD OF THE INVENTION

The present invention relates generally to coding algorithms for a digital communications system and, more particularly, to a reduced search symbol estimation algorithm for decoding convolutional codes.

BACKGROUND OF THE INVENTION

The basic function of a communication system is to send information over a communication channel from a source that generates the information to one or more destinations. In a digital communication system, the information is converted into a digital format and then transmitted over the communication channel. The transmission of digital information is subject to the adverse effects of the communication channel, such as co-channel and adjacent channel interference, noise, dispersion, and fading. These effects introduce errors called "channel errors" into the transmitted data stream. These effects are particularly severe in a radio communication system.

In 1948, Claude E. Shannon demonstrated in a landmark paper that by proper encoding of the digital information prior to transmission, the errors introduced by a noisy channel can be reduced to any desired level without sacrificing the rate of information transmission. Encoding is the process of adding redundancy to information prior to its transmission so that errors which may occur during transmission can be detected and/or corrected. At the receiving end, the decoder makes use of the redundant information and a priori knowledge of the coding scheme to detect and/or correct errors that may have occurred during transmission of the information.

One class of error correcting codes commonly used in digital communication systems are convolutional codes. In convolutional codes, an information sequence is fed into the encoder k bits at a time. For each k bits input to the encoder, n bits (n>k) are output. The n output bits form a codeword selected from a set of codewords C. Thus, a convolutional code represents a mapping of the k input bits into an n bit codeword selected from a codeword set C.

One fundamental characteristic of a convolutional code is that each codeword output by the encoder is determined not only by the k input bits, but also by the information bits input during a previous coding interval. This dependence on the previous information bits causes the encoder to act like a finite state machine. One method commonly used to represent a convolutional code is with a trellis diagram. An exemplary trellis diagram for a rate ½ convolutional code is shown in FIG. 1. In the code shown in FIG. 1, one bit is input to the encoder during each coding interval and two bits are output. The coded output can thus take one of four possible values. Each trellis node corresponds to one of the four possible values and is often returned to as a node or state. Each column of nodes in the trellis diagram represents an instant of time called a coding interval or stage. The set of nodes repeats for each coding interval. Transitions between states are represented in the trellis diagram as branches connecting nodes in adjacent coding intervals. Each branch is associated with a particular symbol or codeword that could have been transmitted. A series of connected branches defines a path through the trellis. Each path represents a valid received symbol sequence.

Encoding proceeds from left to right through the trellis diagram. At each coding interval, k bits are input to the encoder, which generates a coded output containing n bits. Each path through the trellis diagram extending from the starting state to the ending state corresponds to a valid symbol sequence. It is important to note that there is a one-to-one correspondence between valid symbol sequences and paths through the trellis. The function of the decoder is to determine the symbol sequence transmitted based on the received sequence.

Numerous techniques have been devised for decoding convolutional codes. The fundamental task implemented by each of these various approaches is essentially the same; to find a path through the trellis that is "closest" to the received sequence. The closest path corresponds to the code sequence which has the highest probability of being transmitted given the received sequence.

The method for decoding a received symbol sequence that is considered optimum is called maximum likelihood sequence estimation (MLSE). In MLSE, the decoder tries to find the path through the trellis that best matches a received symbol sequence. Each branch of the trellis is assigned a metric that represents the likelihood of the symbol corresponding to that branch being part of the transmitted symbol sequence. A path metric is then computed for a path by summing the branch metrics associated with each branch in that path. The path that most closely matches the received symbol sequence is the one with the lowest accumulated path metric. The symbol sequence corresponding to the path with the lowest path metric is output as the decoded sequence.

In most codes, the number of possible paths through the trellis is quite large and it is therefore not possible to compute a path metric for every possible path through the trellis. Therefore, great effort has been expended in finding new algorithms that simplify the task of finding the closest path to the received symbol sequence. One such algorithm is called the Viterbi algorithm.

In the Viterbi algorithm, the path with the lowest path metric is found by sequentially moving through the trellis from beginning to end and, at each stage, retaining one "survivor path" for each state or node.- The survivor path is defined as the path leading up to a particular node that has the lowest accumulated path metric. For any given interval, there will be M survivors where M is the number of possible states or nodes. Once the survivor path is determined for each state, the survivor paths are extended to the next interval and the survivors for the next stage are determined. Recursion can proceed indefinitely without the number of surviving paths exceeding M. When the final stage is reached, the decoder determines which of the final survivor paths is optimum and outputs the corresponding bits.

Even though the Viterbi algorithm greatly simplifies the task of finding the closest path, the complexity of the Viterbi algorithm grows exponentially as the memory of the encoder increases. Consequently, the Viterbi algorithm is not used for codes with a long constraint length. Another drawback is that the Viterbi algorithm generates a hard decision.

Another commonly used algorithm is called the M-algorithm (MA). In the MA, for each coding interval in the trellis, the number of surviving paths retained by the decoder is restricted to a fixed number N less the number of possible states. At each stage, the MA chooses the N best paths based on the accumulated path metrics. Thus, the MA restricts the search through the trellis to a fixed number of states at any given time interval. If the selected value for N is too small, there will be a high probability of deleting the path corresponding to the transmitted symbol sequence and hence a high error probability.

Symbol estimation algorithms provide an alternative to sequence estimation algorithms. While typically more complex than sequence estimation algorithms, and not as well understood, this class of algorithms has some advantages. One advantage is that symbol estimation algorithms produce symbol reliability values (soft values) as part of their normal design. In contrast, the Viterbi algorithm needs to be modified in order to produce reliability values. Moreover, the soft values produced by a modified Viterbi algorithm are not as accurate as those produced by symbol estimation algorithms.

Although in this patent application we focus on applications of our invention to decoders for convolutional codes, it is obvious to one skilled in the art that our invention can also be used for estimation of digital symbols in the presence of inter-symbol interference (i.e., for MAP equalization).

SUMMARY OF THE INVENTION

The present invention is a reduced search symbol estimation algorithm that approximates a MAP decoder. The reduced search symbol estimation algorithm includes a forward recursion, a backward recursion, and a combining step. For each stage k, the decoder performs a forward recursion up to stage k-1 and a backward recursion up to stage k. To reduce complexity, the decoder does not retain all stages during the forward and backward recursions. Instead, at each stage of the forward and backward recursions, the number of surviving states is limited to a predetermined number of states which is less than the total number of possible states. Surviving states in the forward recursion are denoted $Q_k$. Surviving states in the backward recursion are denoted $R_k$. At each stage of the recursion, the decoder extends branches one stage forward (or backward) from the survivors at the previous stage. The states at which the extended branches end become candidate states. The decoder compares the accumulated path metrics for the branches $B_K$ for each candidate state and retains a predetermined number of states that is less than the total number of states.

During the combining step, a log-likelihood ratio or soft value is computed for the current stage k by combining the forward state metrics for the survivors in $Q_{k-1}$, the backward state metrics for the survivors in $R_k$, and the branch metrics connecting survivors in both sets. To calculate the likelihood ratio, the set of connecting branches $B_k$ is partitioned into two subsets, $B_{k0}$ and $B_{k1}$, corresponding respectively to either 0 or 1 for the current bit. The log likelihood ratio is then given by the following equation:

$$L_k = \max_{B_{k0}} * (\alpha_{k-1}(s') = c_k(s', s) + \beta_k(s)) - \max_{B_{k1}} * (\alpha_{k-1}(s') + c_k(s', s) + \beta_k(s))$$

To prevent the set $B_k$ from being empty, the decoder can perform an augmenting step during the forward and backward recursions. For example, assume that the augmenting step is performed during the backward recursion. The decoder would perform a complete forward recursion, storing the state metrics for the survivors at each stage. During the backward recursion, the decoder would determine the survivor states at each stage based on the accumulated path metrics. The decoder would then determine whether the survivors at stage k in the backward recursion include a survivor from the forward recursion at the same stage. If not, the decoder would select a survivor state from the same stage of the forward recursion to include as a survivor in the backward recursion. This procedure can also be used to ensure that neither subset of $B_k$ is empty.

In another embodiment of the invention, an augmenting step is performed after the forward and backward recursions but prior to the computation of the likelihood ratio. That is, prior to computing the likelihood ratio, the decoder determines whether any connecting branches exist connecting survivors in $Q_{K-1}$ to backward survivors in $R_K$. If not, an alternate survivor is selected for inclusion in either $Q_{K-1}$ or $R_K$ to enable calculation of the likelihood ratio. The alternate state could be selected by extending branches forward (or backward) one stage from one of the survivors and selecting the best extended path. Another method would be to trace back along a survivor path from one of the current survivors to find a path that had been previously deleted. For example, the decoder could trace back from the survivors in $R_k$ to find deleted branches that connect to members in $Q_k$. The shortest regenerated path would then be included in $R_k$.

DETAILED DESCRIPTION OF THE INVENTION

Figure 1:
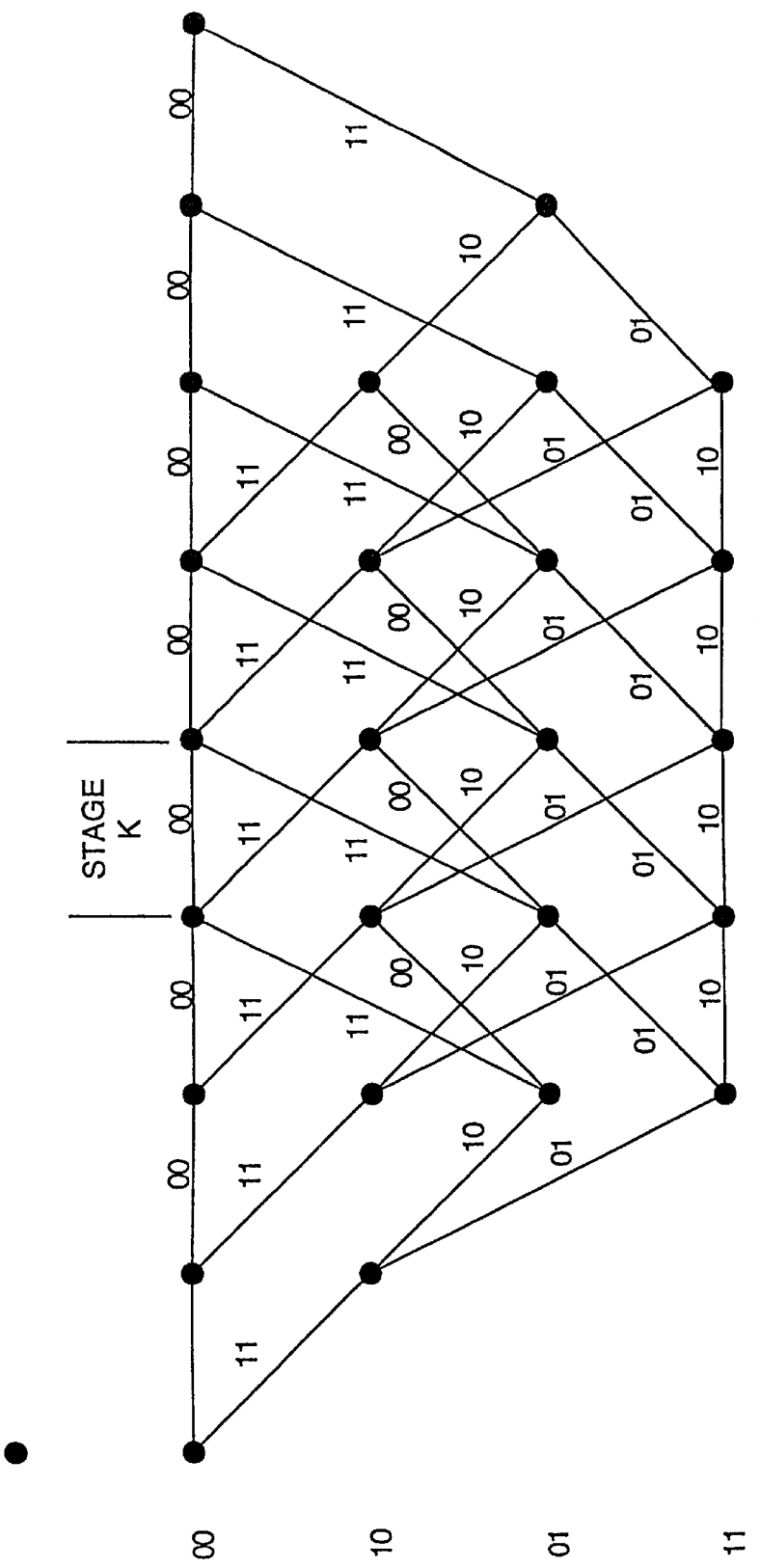
FIG. 1 is a trellis diagram for a rate ½ convolutional code.
Figure 2:
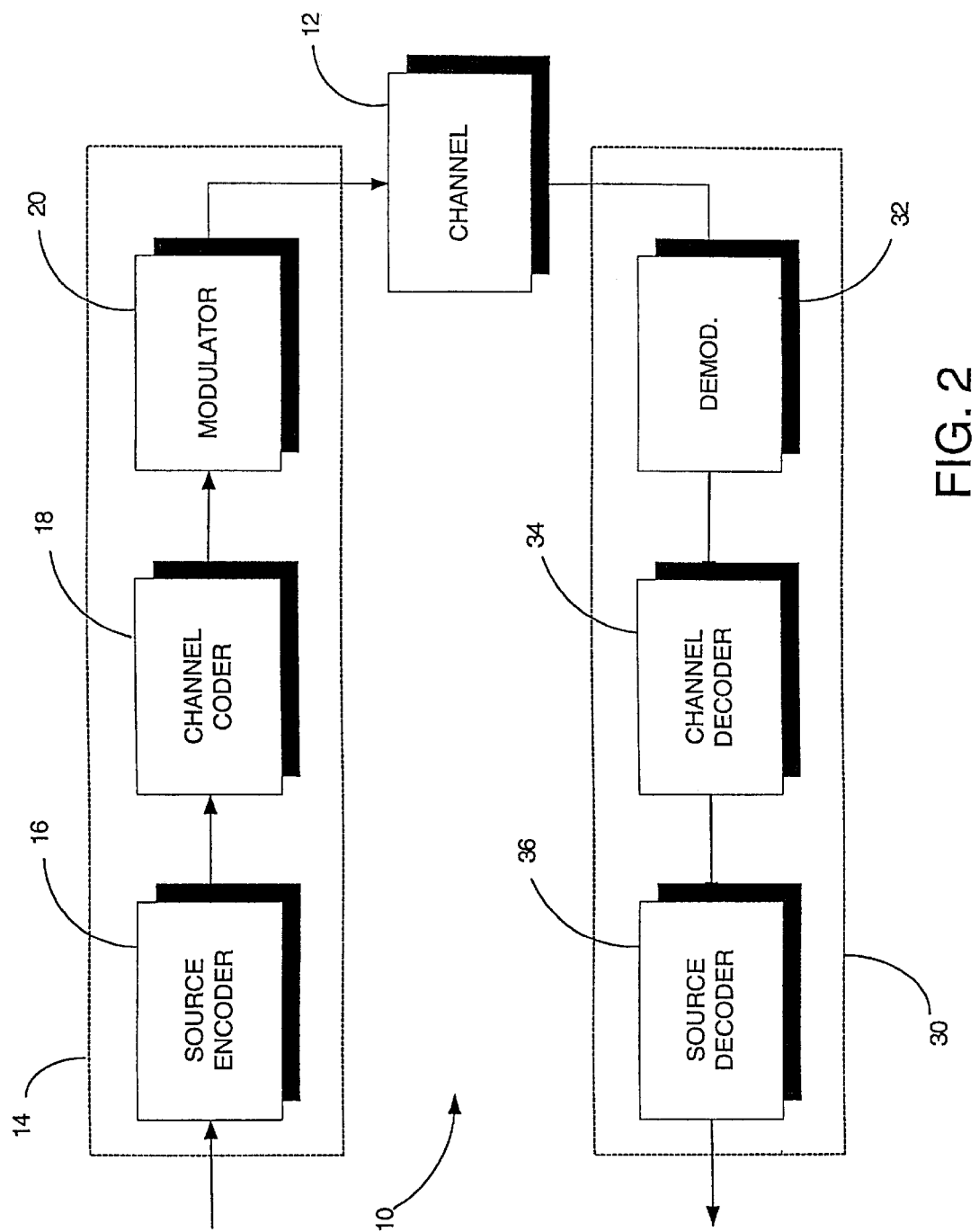
FIG. 2 is a block diagram of a digital communication system.

FIG. 2 illustrates a digital communication system, generally indicated by the numeral 10. The system 10 consists generally of a transmitter 14 and a receiver 30 which are coupled by a communications channel 12. The transmitter 14 includes a source encoder 16, a channel coder 20, and a modulator 22. An information source provides the source data stream, I, that is to be ultimately conveyed to the receiver 30. This source data is assumed to be in a digitized format and is passed directly to the source encoder 16. The source encoder 16 removes redundancy or randomizes the source data stream, producing an information sequence, X, which has been optimized for maximum information content. The information sequence from the source encoder 16 is passed to the channel coder 18.

The channel encoder 18 is designed to introduce an element of redundancy into the information sequence, X, which is supplied by the source encoder 16 to generate a coded output, Y. While initially appearing at odds with the function of the source encoder 16 previously discussed, in reality the redundancy added by the channel coder 18 serves to enhance the error correction capability of the communication system. By introducing redundant information into the information sequence in a controlled manner, a receiver having knowledge of the code used can detect and possibly correct errors which may occur during transmission by making use of the redundant information.

The modulator 20 interfaces the channel coder 18 to the communications channel 12. The modulator 20 receives coded output from the channel coder 18 and generates waveforms that can be efficiently transmitted over the channel 12. The term "signal constellation" is often used to refer to the set of possible signal waveforms available for mapping of the coded output of the channel coder 18. These output waveforms, or signal constellation schemes, are generally selected with regard to either simplification of the communication system, optimal detection performance, power requirements, or bandwidth availability. Typical signal constellations used in digital communications system modulation include 16QAM, 8-PSK, 4-PSK and the like.

At the receiver 30 of the digital communications system 10, a demodulator 32 processes the output waveform (which is corrupted by the channel 12 during transmission) at any given time to determine which of the possible signals in the signal constellation was transmitted. For example, when binary modulation is used, the demodulator 32 processes the received waveform and decides whether a transmitted bit is a 0 or 1. The output of the demodulator is the received sequence Z. The output of the demodulator 32 is passed to a decoder 34 which attempts to reconstruct the original information sequence X from its a priori knowledge of the code used by the channel coder 16. A measure of how well the demodulator 32 and decoder 34 perform is the frequency with which errors occur in the decoded sequence. As a final step, when an analog output is desired, a source decoder 36 accepts the output sequence from the decoder 34, and from knowledge of the source encoding method, attempts to reconstruct the original signal from the information source. The difference between the reconstructed signal and the original signal is a measure of the distortion introduced by the communication system.

A MAP decoder uses the a posteriori probabilities to obtain estimates of the information symbols that were transmitted. Assume, for example, that an information sequence x is mapped into a codeword y. For the kth bit $x_k$, let $C_0$ denote codewords y in C corresponding to information blocks having a 0 at the kth position and $C_1$ denote codewords y in C corresponding to information blocks having a 1 at the kth position. The MAP decoder processes the received sequence z to produce a log-likelihood ratio $L_k$ for a given information bit $x_k$ using the following formula:

$$L_k = \ln\left(\frac{\sum_{y \in C_0} p(y|z)}{\sum_{y \in C_1} p(y|z)}\right) \quad \text{Eq. (1)}$$

The MAP decoder calculates a likelihood ratio at each stage of the decoding process and chooses a symbol based on the likelihood ratio. The numerator of the likelihood ratio is the sum of the probabilities for all codewords y in $C_0$. The denominator is the sum of the probabilities for all codewords y in $C_1$. If the ratio is greater than 1, the decoder outputs a 0 as the estimate of $x_k$. If the ratio is less than 1, the decoder outputs a 1 as the estimate of $x_k$. A well-known technique used for producing (1) is the BCJR algorithm. The BCJR algorithm is described in detail in *Optimal Decoding of Linear Codes for Minimizing Symbol Error Rate, IEEE J. Trans. Information Theory*, vol. IT-20, pp. 284–287, 1974, which is incorporated herein by reference. The MAP decoder is computationally intensive, but has the advantage of the generating soft values as a normal part of the decoding process.

Equation (1) can be used not only to find log-likelihoods of information bits, but also log-likelihoods of coded bits. This is particularly useful in multi-pass demodulation, sometimes referred to as Turbo equalization, in which demodulation is performed a second time using information from the decoder. Preferably, extrinsic information would be passed to the second-pass demodulator, which would be formed by subtracting the first pass demodulator log-likelihood value from the decoder output log-likelihood value. In general, log-likelihood or likelihood values may be used and are generally referred to as soft values.

Figure 3:
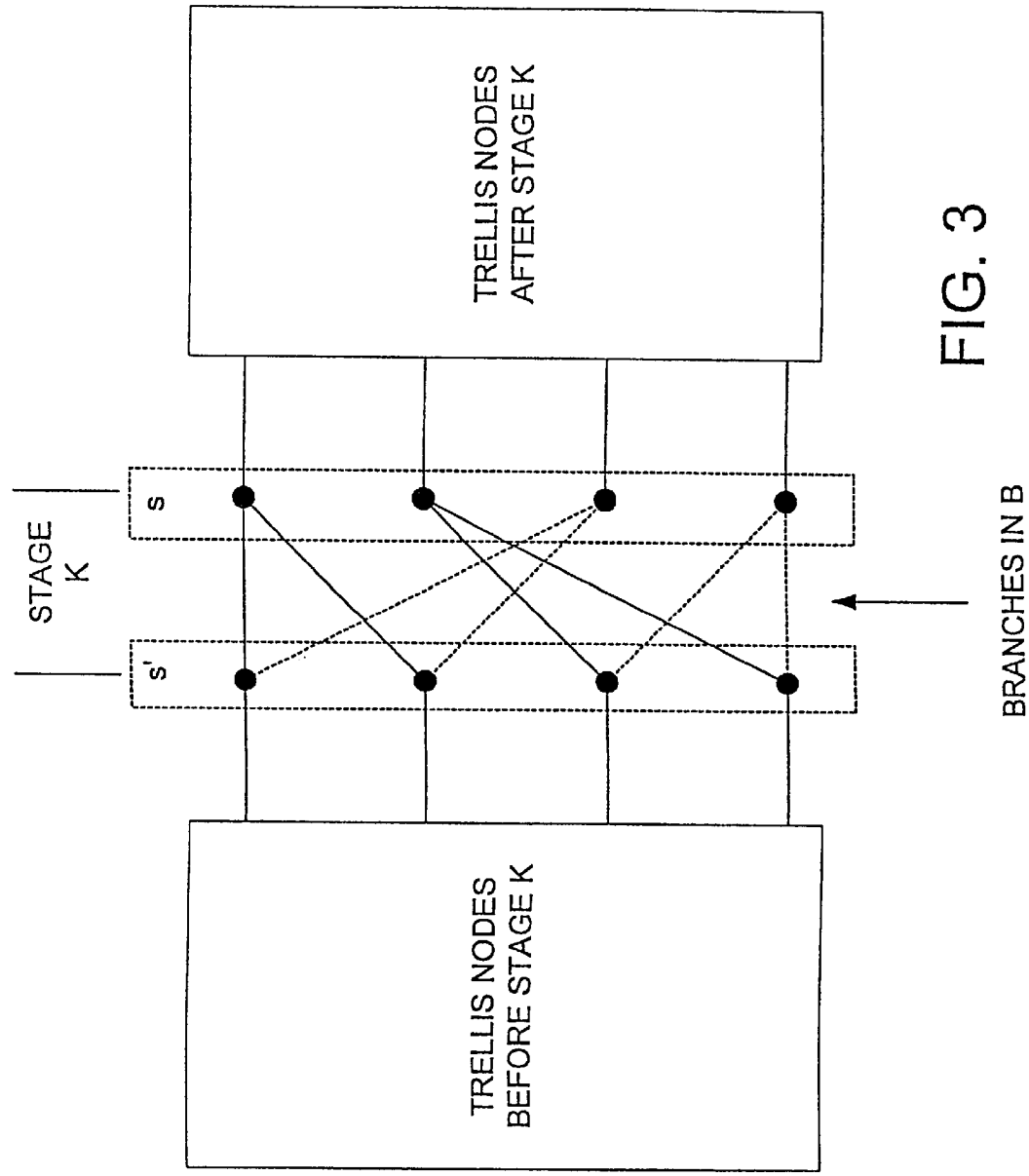
FIG. 3 is a trellis diagram illustrating a method for computing a likelihood ratio for a decoded symbol using accumulated path metrics from forward and backward recursions.

In *An Intuitive Justification and a Simplified Implementation of the MAP Decoder for Convolutional Codes, IEEE J. Selected. Areas in Communication*, Vol. 16, pp. 260–264 (1998), a method of MAP decoding is described consisting of a forward and backward Viterbi decoding step and a combination step. Referring to FIG. 3, suppose that $L_k$ is sought for the kth bit. To simplify the discussion, it will be assumed that the trellis is binary so that one branch corresponds to a single bit. The process can be easily generalized to treat multiple bits per branch. A forward state metric is computed for each beginning state s' at the kth stage by applying the Viterbi algorithm. Denoting the state metric for state s' at the (k−1)th node as $a_{k-1}(s')$, the state metric for state s at the kth node as $a_k(s')$, and the branch metric connecting state s' at $\text{node}_{k-1}$ and state s at node k as $c_k(s', s)$, the forward metric for a given state s can be given by the following equation:

$$a_k(s) = \max_{s'} {}^*(a_{k-1}(s') + c_k(s', s)) \quad \text{Eq. (2)}$$

A backward state metric is computed for each ending state s at the kth stage by performing a backward Viterbi algorithm. Denoting the state metric for state s' at the (j−1)th node as $b_{j-1}(s')$, the state metrics for state s at the kth node as $b_j(s)$, and the branch metric connecting state s' at node k−1 and state s at node k as $c_k(s', s)$, the backward metric for a given state s' can be given by the following equation:

$$b_{j-1}(s') = \max_{s} {}^*(b_j(s') + c_j(s', s)) \quad \text{Eq. (3)}$$

The function max* used in the forward and backward recursions is defined as follows:

$$\max{}^*(u_1, u_2, \ldots, u_n) = \ln(e^{u_1} + e^{u_2} + \ldots + e^{u_n}) \quad \text{Eq. (4)}$$

For a given stage k, the likelihood ratio is then computed by combining the forward state metrics for the beginning states s', the backward state metrics for the ending states s, and the branches connecting the beginning and ending states, s' and s. The set of connecting branches B is partitioned into the set $B_0$ of branches that correspond to $x_k$0 and the complementary set $B_1$ of branches that correspond to $x_k$=1. The likelihood ratio is then given by the following equation:

$$L_k = \max_{B_0} {}^*(a_{k-1}(s') + c_k(s', s) + b_k(s)) - \max_{B_1} {}^*(a_{k-1}(s') + c_k(s', s) + b_k(s)) \quad \text{Eq. (5)}$$

One problem with MAP decoding is that it is generally more complex than sequence decoding. The present invention is a reduced complexity symbol estimation algorithm that approximates a MAP decoder with a much lower degree of complexity.

To briefly summarize, the reduced search symbol estimation algorithm includes a forward recursion, a backward recursion, and a combining step. To reduce complexity, the present invention does not retain all states during the forward and backward recursions. Instead, at each stage of the forward and backward recursions, the number of surviving states is restricted to a predetermined number of states selected from a group of candidate states. Candidate states are those states connected by branches to survivors from the previous stage of the recursion. The decoder compares the accumulated path metrics for each candidate state and retains a specified number of states that is less than the total number of states in the trellis. For the forward recursion, the retained states or survivor states, denoted as $Q_{k1}$ are stored along with the corresponding state metrics. For the backward recursion, the retained states, denoted as $R_k$, are stored along with the corresponding state metrics. During the combining step, the computation of $L_k$ is restricted to branches (s',s) connecting survivor states s' and s in the forward and backward recursions respectively.

Figure 4:
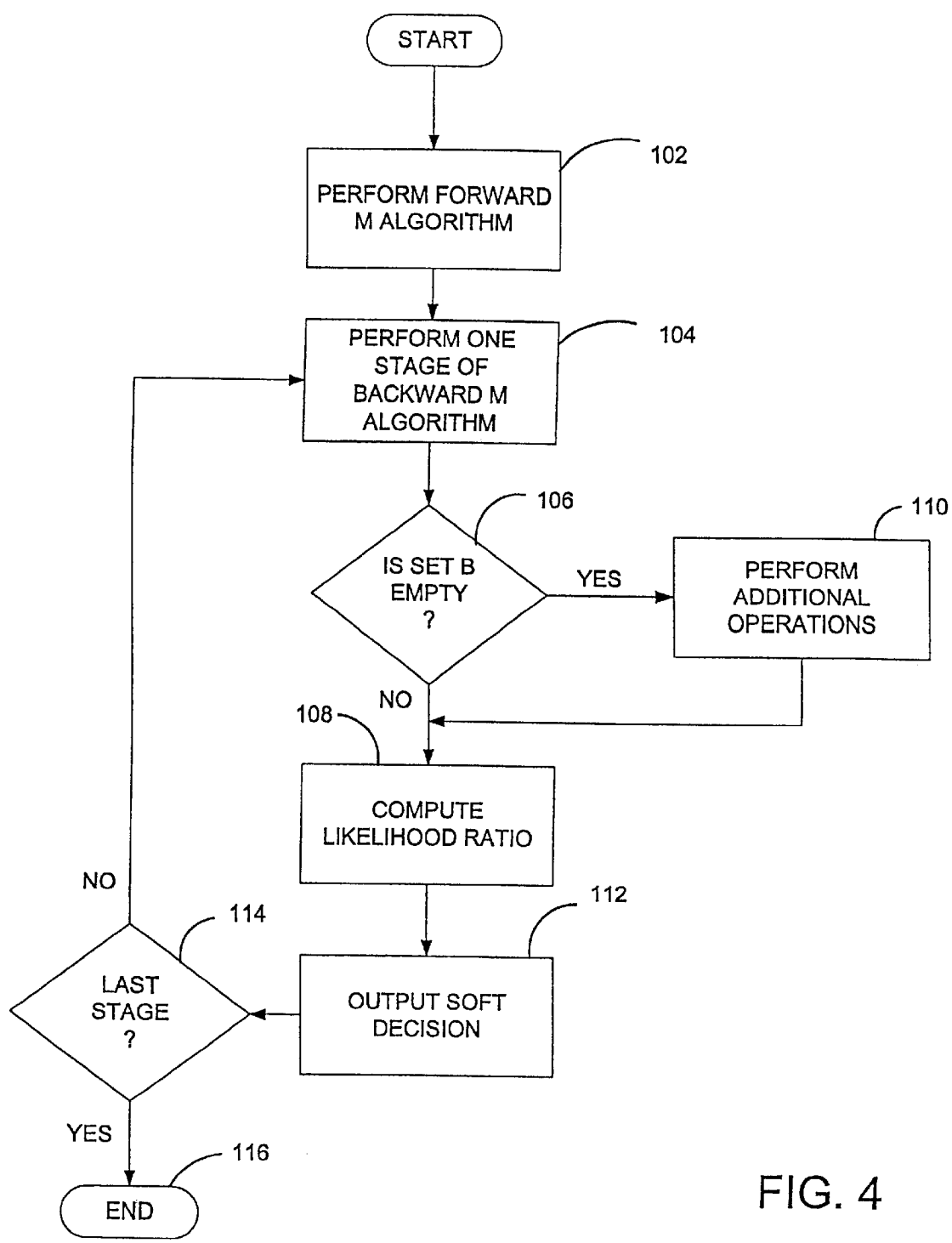
FIG. 4 is a flow diagram illustrating the decoding method of the present invention.

FIG. 4 is a flow diagram illustrating the decoding method of the present invention. Suppose that $L_k$ is sought for the information bit $x_k$. A forward recursion through the trellis is performed for all stages using a reduced complexity search algorithm such as the M Algorithm (block 102). The forward recursion is defined by the following equation:

$$a_k(s) = \max_{s'} * (a_{k-1}(s') + c_k(s', s)) \quad \text{Eq. (6)}$$

where $\alpha_{k-1}(s')$ is the state metric associated with a state s' belonging to the set $Q_{k-1}$ of surviving states at the k−1 stage. A backward recursion is performed beginning at the ending state of the trellis up to stage k (block 104). The backward recursion is defined by the following equation:

$$b_{k-1}(s') = \max_{s'} * (b_k(s) + c_j(s', s)) \quad \text{Eq. (7)}$$

where $\beta_{k-1}(s')$ is the state metric associated with a state s belonging to the set $R_k$ of surviving states at stage k. For all pairs (s', s) for which a connecting branch exists, it is possible to combine the forward state metric for state s', the backward state metric for state s, and the branch metric for the connecting branch to obtain the likelihood for the kth bit. Branches connecting pairs (s', s) are denoted as $B_k$. After performing the backward recursion, the decoder 34 determines whether any branches $B_k$ exist connecting pairs (s',s) (block 106). Where no branch $B_k$ exists, the decoder 34 must perform additional operations to produce a likelihood ratio (block 110). To calculate the likelihood ratio, the set of connecting branches $B_k$ is partitioned into two subsets, $B_{k0}$ and $B_{k1}$, corresponding respectively to either 0 or 1 for the current bit. The log-likelihood ratio is then given by the following equation:

$$L_k = \max_{B_{k0}} * (\alpha_{k-1}(s') + c_k(s', s) + \beta_k(s)) - \quad \text{Eq. (9)}$$

$$\max_{B_1} * (\alpha_{k-1}(s') + c_k(s', s) + \beta_k(s))$$

which is computed (block 108) and output as a soft decision (block 112). After outputting a symbol the decoder checks whether the last stage has been reached (block 114). If not, the decoder moves to the next stage and repeats steps 104–112. When the last stage is reached, the recursion terminates (block 116).

Figure 5:
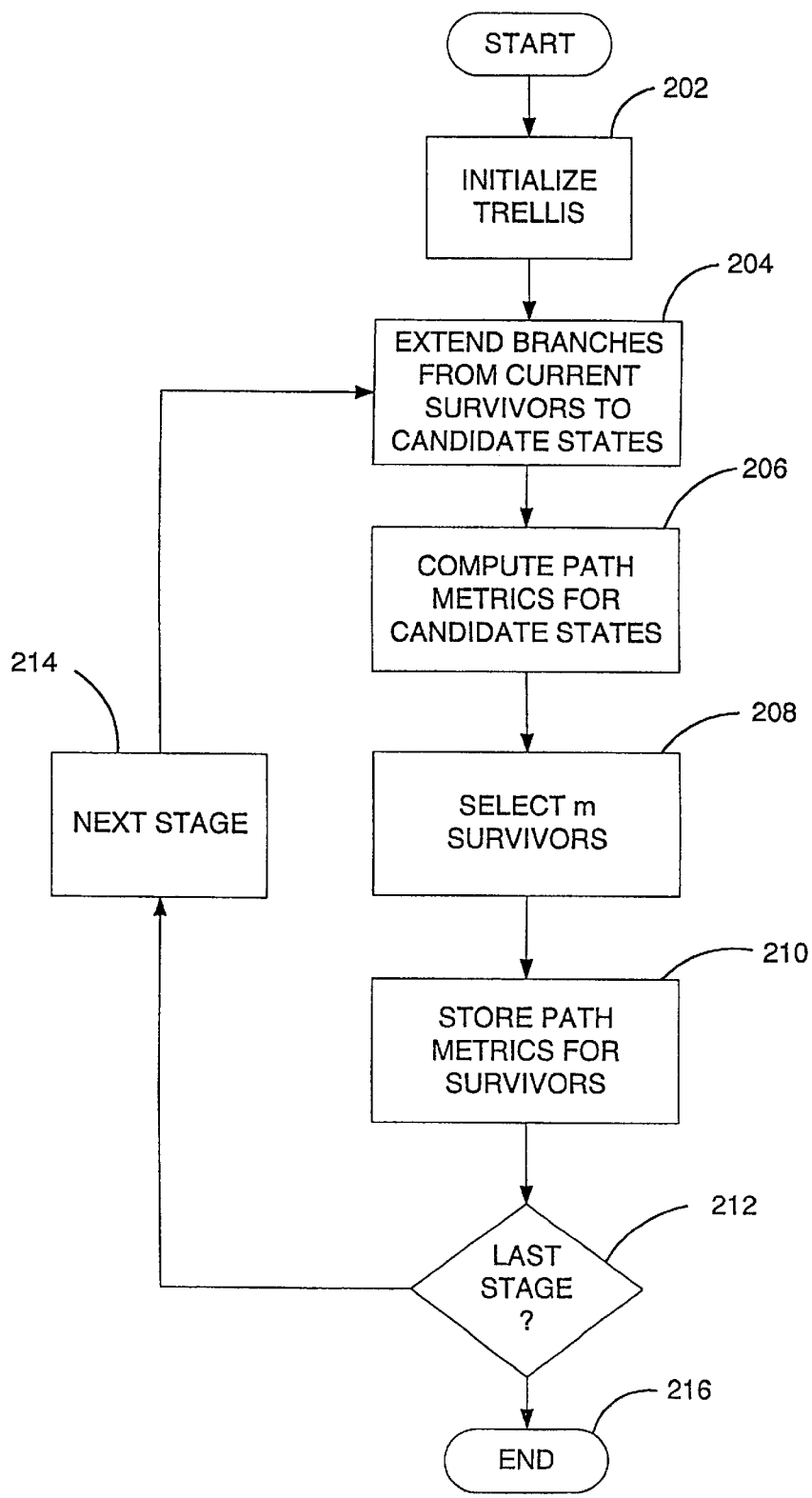
FIG. 5 is a flow diagram illustrating the modified M Algorithm used to implement the decoding method.

The algorithm used to perform the forward and backward recursions is preferably a variation of an algorithm known as the M Algorithm (MA) and is shown in FIG. 5. This algorithm is referred to herein as the modified M Algorithm (M*A). The decoder 34 is initialized, usually to the all zero state and the accumulated path metric is initialized to zero (block 202). The decoder 34 extends branches from each current survivor to the next stage (block 204). The states at the ends of the extended branches are called candidate states. At the initial stage of the recursion, there will be only a single survivor, which is the all zero state. A path metric is then computed for each candidate state (block 206) using the max* function shown in equation (4) or any approximation to (4). Some states may have multiple paths leading into the state. In that case, the decoder 34 may use the greater of the path metrics for all paths leading into the state, which shall be referred to as the maximum accumulated path metric. Or, it may use the max * operation to combine path metrics. After computing the maximum accumulated path metric for the candidate states, the decoder 34 chooses the best m states (where m is an integer less than the total number of possible states) based on the accumulated path metrics. The path metrics for the set of survivor states at the current stage k, denoted as $Q_k$ for the forward recursion and $R_k$ for the backward recursion, are then stored in memory (block 210). This process is repeated until the final stage is reached (block 212) at which time the recursion terminates (block 214).

There are several drawbacks to using the reduced search symbol estimation algorithm described above if the number N of survivor states retained at each stage of the forward and backward recursion is small compared to the total number of states. First, the set $B_k$ may be empty because the survivors in $Q_{k-1}$ and $R_k$ are far apart. That is, there are no branches connecting survivor states in the forward recursion to survivor states in the backward recursion. This means that the decoder 34 will not be able to compute a reliability value for the current bit. Even if the set $B_k$ is not empty, one of the subsets, $B_{k0}$ and $B_{k1}$, could be empty. If $B_{k0}$ is empty, then its corresponding max* term must be replaced by negative infinity, or some other large negative number. In a sense, this means that the decoder 34 is producing a hard value for the current bit.

Figure 6:
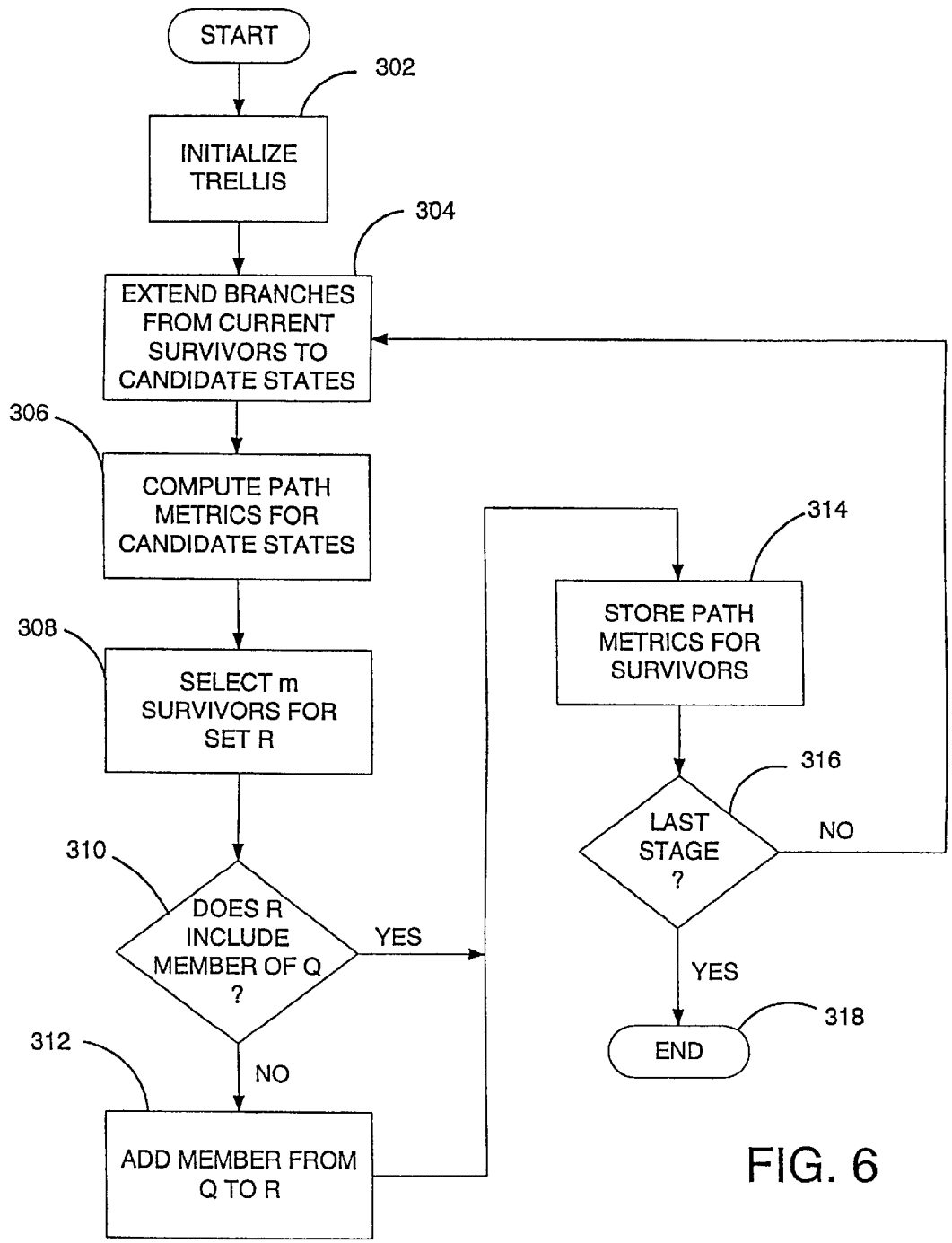
FIG. 6 is a flow diagram illustrating the modified M Algorithm with an additional augmenting step.

Referring now to FIG. 6, a modification of the M*A will be described that ensures that the set $B_K$ will not be empty. First, a complete forward M*A is performed as shown in FIG. 5 to obtain the set $Q_k$ of survivor states at each stage k of the trellis. During the forward recursion, the state metrics for the survivor states $Q_k$ at each stage k are then stored in memory. A backward recursion is then performed as shown in FIG. 6. The decoder 34 is initialized (block 302) and then the branches are extended from the beginning state to the next stage (block 304). Path metrics for the candidate states are computed (block 306) and the survivors $R_k$ are chosen (block 308). After the survivors are selected, the decoder determines whether $R_k$ includes a member of $Q_k$ at the same stage k of the trellis. If not, in addition to the best N states, at least one state $Q_k$ from the forward recursion is retained. The chosen member of $Q_k$ could replace an existing member of $R_k$ or could simply be added to the existing members of $R_k$. This additional step ensures that $B_k$ is not empty. Equivalently, the same procedure could be used to augment $Q_k$ instead of $R_k$. To prevent the subsets of $B_k$ from being empty, two members of $Q_k$ could be selected for inclusion in $R_k$ one with an ending branch corresponding to $X_k=0$ and the other with an ending branch corresponding to $X_k=1$.

Figure 7:
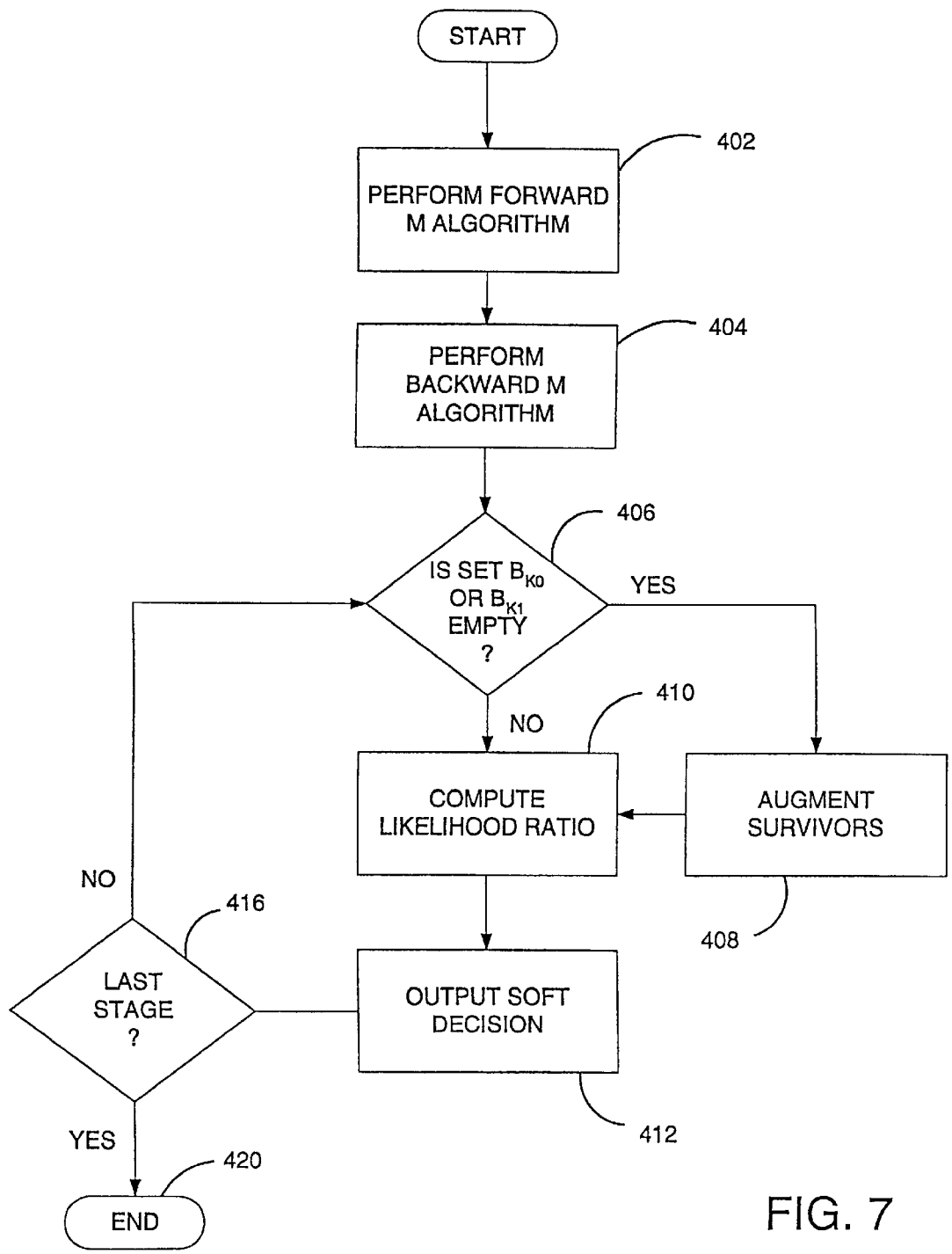
FIG. 7 is a flow diagram showing a second embodiment of the decoding method having an augmenting step.

FIG. 7 illustrates another modification to the decoding method that ensures that the subsets of $B_k$ are not empty. In this method, a complete forward recursion (block 402) and backward recursion (block 404) are performed. An augmenting step is then performed before the combining step. As shown in FIG. 7, the decoder determines whether the subsets $B_{k0}$ or $B_{k1}$ are empty. If either subset is empty, the decoder performs the additional augmenting step (block 408). Say, for example, that the subset $B_{k0}$ is empty. The decoder 34 augments the set $Q_{k-1}$ by adding an alternate state $s'_a$ that was not selected during the forward recursion. One method for finding the alternate state $s'_a$ would be for the decoder 34 to extend branches corresponding to $X_k=0$ from each of the survivors in $R_k$ and choose the state that is the best and add it to the set $Q_{k-1}$. The alternate state could be added as an additional member to $Q_{k-1}$ or could replace an existing member of $Q_{k-1}$. The same method could be used to ensure that the subset $B_{k1}$ is not empty. After the augmenting step, the likelihood ratio can then be computed (block 410). Following the computation of the likelihood ratio the decoder 34 chooses a symbol to output (block 412). After outputting a symbol, the decoder 34 checks whether the last stage has been reached (block 416). If not, the decoder 34 moves to the next stage (block 418) and repeats steps 406–412 until the end of the information block is reached, at which time the process ends (block 420).

Figure 8:
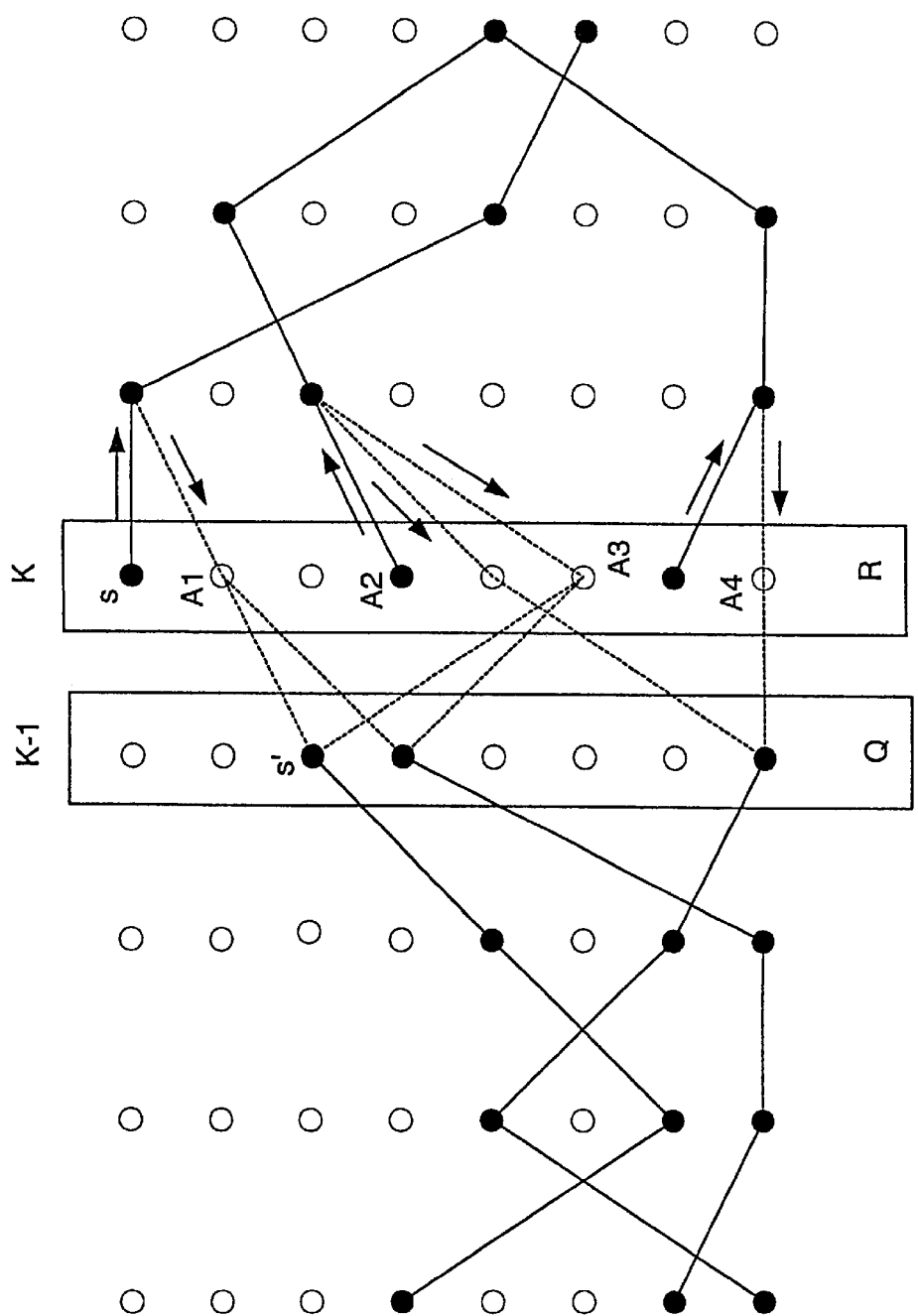
FIG. 8 is a trellis diagram illustrating a method for regenerating that is used to implement the decoding method.

FIG. 8 shows another method for augmenting $Q_K$ that involves regenerating previously deleted branches. FIG. 8 shows the state of the decoder 34 after the forward recursion and backward recursion have been performed. As seen in FIG. 8, there are no branches connecting the survivor states s', s in $Q_{k-1}$ and $R_k$. When the set $B_k$ is empty, the decoder 34 can trace back along the survivor paths in either the forward or backward recursions to find a path that was previously deleted connecting to a survivor in $R_k$ or $Q_k$, respectively. As shown by arrows in FIG. 8, the decoder 34 traces back along the survivor path from each of the survivors in $R_k$. While tracing back, the decoder 34 finds the deleted paths (shown in dotted lines) which connect to the members in $Q_k$. The decoder 34 then selects one of their paths and regenerates the selected path. FIG. 8 shows four deleted branches leading to possible alternate states A1–A4. One of the alternate paths is selected. The node A1, A4 at stage k along the selected path is included in $R_k$. The same approach can be used to regenerate a path in the forward direction starting from a state in $Q_k$. This approach can also be used to find alternate states for $Q_{k-1}$ and $R_k$ that makes $B_{k0}$ and $B_{k1}$ non-empty.

The present invention is useful when decoding Turbo codes. Typically, multiple stages of MAP decoding are used. The present invention can be used to reduce the complexity of each stage, reducing the signal processing power required. For cellular terminals, this reduces battery drain, increasing talk time.

What is claimed is:

1. A method for decoding a received sequence to obtain an estimate of a transmitted sequence comprising:

forming a trellis comprising a plurality of nodes and a plurality of branches, wherein each node represents a particular state at one instant of time and wherein each branch represents a transition between states at different time instants and corresponds to a possible transmitted symbol associated with said transition;

assigning branch metrics to said branches of said trellis;

performing a forward recursion through said trellis starting from a beginning state and, at each stage in said forward recursion:

forming a set of candidate states, wherein said candidate states are those states having entry branches leading from a survivor state in the previous recursion;

computing the forward path metric for each candidate state based on said branch metrics;

forming a set Q of forward survivor states selected from said set of candidate states based on the forward path metrics for said candidate states, wherein the number of members in Q is less than the number of candidate states;

storing the forward path metric for each member state in Q;

performing a backward recursion through said trellis starting from an ending state and, at each stage in said backward recursion;

forming a set of candidate states, wherein said candidate states are those states having entry branches leading from a survivor state in the previous recursion;

computing the backward path metric for each candidate state based on said branch metrics;

forming a set R of backward survivor states selected from said set of candidate states based on the backward path metrics for said candidate states, wherein the number of members in R is less than the number of candidate states;

storing the backward path metric for each member state in Q;

for each stage k of said trellis, computing a soft value based on said accumulated forward path metrics for the survivor states in the set $Q_{k-1}$, the accumulated backward path metric for the survivor states in the set $R_k$, and the branch metrics for the branches in the set B of branches connecting survivors states in $Q_{k-1}$ and $R_k$.

2. The decoding method according to claim 1 further including augmenting at least one of the sets Q and R during said forward or backward recursion respectively to include at least one member of the other set at the same trellis stage so that B will not be empty during said computing step.

3. The decoding method according to claim 2 further including grouping the members of B into a plurality of subsets based on the symbol represented by said branches, and wherein at least one of the sets Q and R is augmented during said forward or backward recursions respectively to include alternate members such that no subset of B will be empty during said computing step.

4. The decoding method according to claim 1 further including, prior to said computing step, determining whether the set B is empty, and, if so, augmenting at least one of the sets Q and R to include at least one alternate member having a branch connecting to a member in the other set.

5. The decoding method according to claim 4 wherein said augmenting step comprises tracing back along a survivor path leading to a survivor state in Q or R, finding a deleted path that connects to a member in the other set, regenerating said deleted path, and selecting a node along the regenerated path to include in Q or R.

6. The decoding method according to claim 4 further including grouping members of B into a plurality of subsets based on the symbol represented by said branches, determining whether any subset of B is empty, and, if so, augmenting at least one of the sets Q and R to include an alternate member having a branch that belongs to said empty subset of B.

7. A method for using a trellis to decode a received sequence to obtain an estimate of a transmitted sequence comprising:

performing a forward recursion through said trellis, and at each stage of said forward recursion selecting a predetermined number of survivor states that is less than the number of possible states;

computing a forward state metric for said survivor states at each stage in said forward recursion;

performing a backward recursion through said trellis, and at each stage of said backward recursion selecting a predetermined number of survivor states that is less than the number of possible states;

computing a backward state metric for a predetermined number of for said survivor states at each stage in said backward recursion;

at each stage of said trellis, computing a soft value based on said forward and backward state metrics, and branch metrics for connecting branches connecting said survivor states in said forward and backward recursions; and at each stage, choosing a symbol based on said soft value.

8. The decoding method according to claim 7 further including selecting an alternate survivor state when there are no connecting branches to make the set of connecting branches non-empty.

9. The decoding method according to claim 7 wherein computing said likelihood ratio includes grouping the connecting branches into subgroups corresponding to the symbols represented by said connecting branches.

10. The decoding method according to claim 9 further including selecting an alternate survivor state when there are no connecting branches in a subgroup of the connecting branches to make the empty subgroup non-empty.

11. A communications system comprising:
a receiver having a decoder for decoding a received sequence received over said communication channel to generate an estimate of the encoded sequence, said decoder including:
a branch metric calculator for calculating branch metrics for branches in a trellis;
a first processor for performing a forward recursion through said trellis and, at each stage of said trellis, selecting a predetermined number of survivor states which is less than the total number of states in said trellis;
a second processor for performing a backward recursion through said trellis and, at each stage of said trellis, selecting a predetermined number of survivor states which is less than the total number of states in said trellis;
a first state metric generator for computing a state metric for said survivor states in each stage of said forward recursion;
a second state metric generator for computing a state metric for said survivor states in each stage of said backward recursion;
soft value generator for computing a soft value based on said forward state metrics, said backward state metrics, and said branch metrics.

\* \* \* \* \*